(12) United States Patent
Leong et al.

(10) Patent No.: US 7,180,377 B1
(45) Date of Patent: *Feb. 20, 2007

(54) METHOD AND APPARATUS FOR A HYBRID PHASE LOCK LOOP FREQUENCY SYNTHESIZER

(75) Inventors: Colin Wai Mun Leong, Livermore, CA (US); Jagdeep Singh Bal, Saratoga, CA (US); Richard Miller, Los Altos, CA (US)

(73) Assignee: Silicon Clocks Inc., Oakland, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 11/039,113

(22) Filed: Jan. 18, 2005

(51) Int. Cl.
*H03L 7/87* (2006.01)
*H03L 7/95* (2006.01)
(52) U.S. Cl. .................... 331/17; 331/DIG. 2; 327/157
(58) Field of Classification Search ................ 331/17, 331/DIG. 2; 327/157
See application file for complete search history.

(56) References Cited

U.S. PATENT DOCUMENTS

| | | | |
|---|---|---|---|
| 3,660,781 A | 5/1972 | Tewksbury et al. | |
| 5,057,793 A | 10/1991 | Cowley et al. | |
| 5,644,743 A * | 7/1997 | Barrett et al. ................ | 375/375 |
| 5,739,727 A | 4/1998 | Lofter et al. | |
| 5,955,928 A * | 9/1999 | Smith et al. ................... | 331/2 |
| 6,028,460 A | 2/2000 | McCollum et al. | |
| 6,657,464 B1 | 12/2003 | Balardeta et al. | |

OTHER PUBLICATIONS

U.S. Appl. No. 10/993,592, Colin Wai Mun Leong, Hybrid Analog/Digital Phase Lock Loop Frequency Synthesizer, filed Nov. 19, 2004.

* cited by examiner

*Primary Examiner*—Robert Pascal
*Assistant Examiner*—James Goodley
(74) *Attorney, Agent, or Firm*—Carr & Ferrell LLP (57) ABSTRACT

A hybrid frequency synthesizer includes an analog phase lock loop (PLL), a digital PLL, and a control circuit to control an output oscillator. The control circuit assigns control of the output oscillator between the analog PLL and/or the digital PLL depending on a state of lock of the analog PLL and/or the digital PLL. During a frequency acquisition mode, the digital PLL provides a coarse control of the output oscillator. During a phase capture mode, the analog PLL provides a fine control and the digital PLL provides a coarse control of the output oscillator. During the phase capture mode, the analog PLL control signal and the digital PLL control signal may be given a percentage of control over the output oscillator depending on the state of lock of the analog PLL and/or the digital PLL. During a phase lock mode, the analog PLL controls the output oscillator.

21 Claims, 6 Drawing Sheets

METHOD AND APPARATUS FOR A HYBRID PHASE LOCK LOOP FREQUENCY SYNTHESIZER

CROSS REFERENCE TO A RELATED APPLICATION

The present invention is related to U.S. patent application Ser. No. 10/993,592, entitled "HYBRID ANALOG/DIGITAL PHASE LOCK LOOP FREQUENCY SYNTHESIZER", filed Nov. 19, 2004, which is hereby incorporated by reference in its entirety.

BACKGROUND OF THE INVENTION

1. Field of the Invention

The present invention generally relates to the field of phase lock loop frequency synthesizers and multipliers, and specifically to a hybrid phase lock loop that includes a digital phase lock loop and an analog phase lock loop.

2. Description of the Related Art

Generally, communication systems utilize various forms of phase lock loop (PLL) circuits to synchronize one or more output signals, e.g., carrier signals, to a reference signal. One conventional analog PLL includes a stable low frequency reference oscillator, e.g., a voltage controlled crystal oscillator (VCXO), coupled to a harmonic generator. A signal output of the harmonic generator provides a reference signal to an analog phase detector. A filtered version of an error signal from the analog phase detector is input to a voltage controlled oscillator (VCO). The oscillator generates an output carrier signal at a desired frequency. The phase detector adjusts (e.g., tunes) the oscillator to synchronize the frequency and phase to the error signal. Unfortunately, the analog PLL adjusts only over a narrow frequency range (i.e., tuning range) due to the limited capture range of the analog phase detector. The analog PLL can phase lock to any harmonic frequency of the reference signal that falls within the tuning range.

Conventional digital PLLs overcome many of the disadvantages of the analog PLL, such as the harmonic lock problem. A digital PLL generally includes a reference oscillator that provides a reference signal to a first digital frequency divider. An output of the first digital frequency divider is coupled to a digital frequency/phase detector. An output of the digital frequency/phase detector is coupled through a loop filter to an output oscillator. A sample of the output carrier signal generated by the output oscillator is coupled to a second digital frequency divider. A signal output of the second digital frequency divider is coupled as a feedback signal to the frequency/phase detector for comparison with the divided reference signal. The output carrier signal frequency is determined by the frequency of the reference signal multiplied by the ratio of the second digital divider to the first digital divider. Due to the wider capture range of the digital frequency/phase detector, the digital PLL provides tuning over a wide range of output carrier signal frequencies. Unfortunately, the digital implementation also encumbers the digital PLL with greater phase noise relative to the analog PLL.

Figure 1:
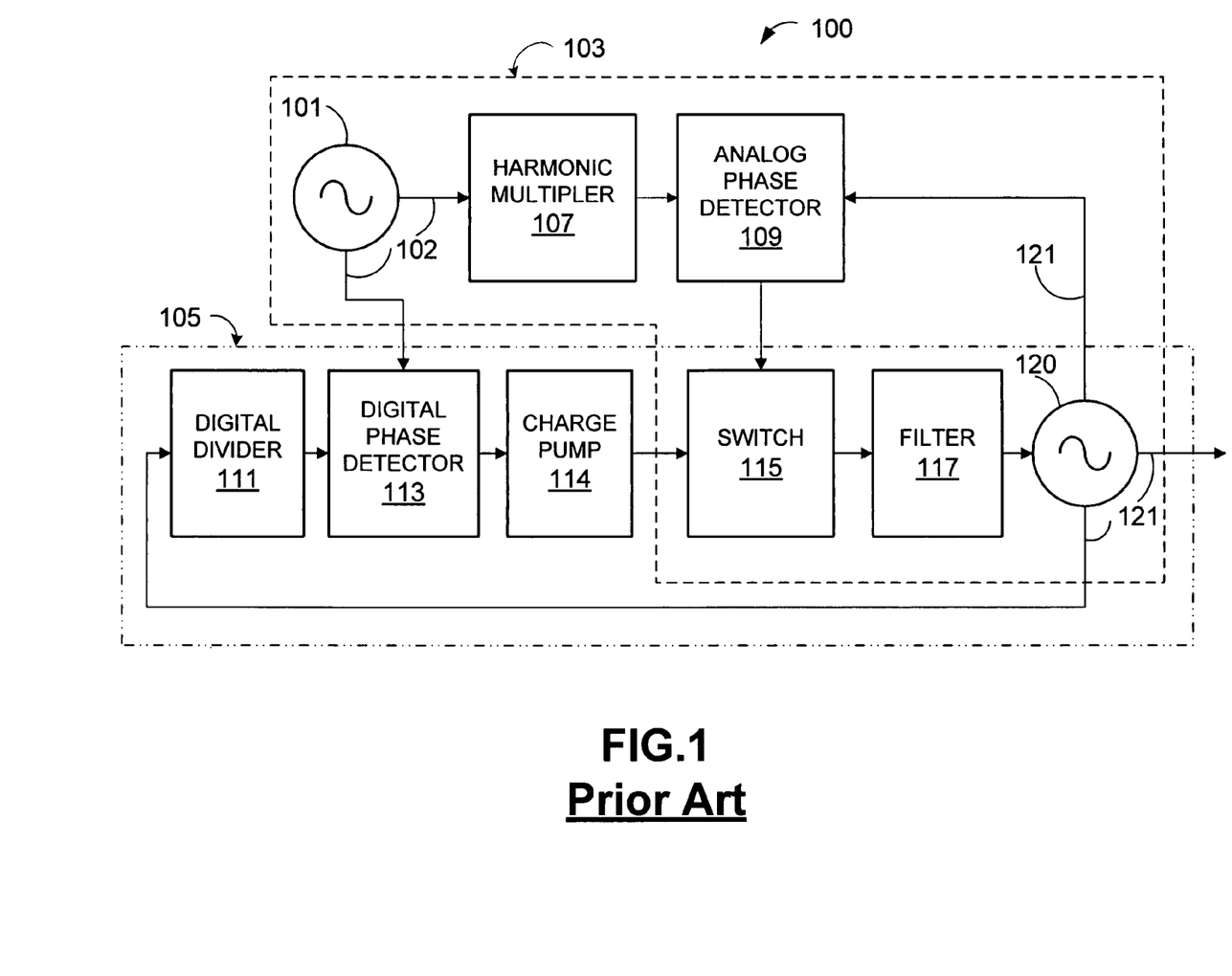
FIG. 1 illustrates a prior art hybrid PLL frequency synthesizer.

Hybrid PLLs have been developed to capitalize on the benefits and avoid limitations of both the analog PLL and the digital PLL, as shown, for example, in U.S. Pat. No. 6,028,460. FIG. 1 illustrates a prior art hybrid PLL frequency synthesizer 100. Generally, such hybrid PLL frequency synthesizer 100 incorporates a hybrid PLL. The hybrid PLL includes a digital PLL 105 and an analog PLL 103. The digital PLL 105 and the analog PLL 103 are configured to individually acquire and phase lock an output carrier signal 121 from an output oscillator 120 to a reference signal 102 provided by a reference oscillator 101. Generally, during a frequency acquisition mode, the digital PLL 105 is used to acquire phase lock. Once the digital PLL 105 is phase locked, a switch 115 switches control of the hybrid PLL from the digital PLL 105 to the analog PLL 103. The analog PLL 103 then phase locks the output carrier signal 121 to a harmonic of the reference signal 102. The analog PLL 103 generally provides superior phase noise performance relative to the digital PLL 105.

The digital PLL 105 includes a digital divider 111, a digital phase detector 113, and a charge pump 114. The digital divider 111 digitally divides a sample of the output carrier signal 121 to the same frequency as the reference signal 102. The digitally divided signal is coupled to the digital phase detector 113 for frequency/phase comparison to the reference signal 102. The digital phase detector 113 provides phase control signals to the charge pump 114. The charge pump 114 provides a digital PLL control signal to a switch 115. When the digital PLL 105 is switched in control of the hybrid PLL, the switch 115 provides the digital control signal to a loop filter 117. The loop filter 117 filters the digital PLL control signal before being coupled to the output oscillator 120.

The analog PLL 103 includes a harmonic multiplier 107 to multiply the reference signal 102 to the same frequency of the output carrier signal 121, or to a down converted version thereof. An analog phase detector 109 generates an analog control signal indicative of a phase comparison between the multiplied reference signal and a sample of output carrier signal 121. When the analog PLL 103 is switched in control of the hybrid PLL, the switch 115 provides the analog PLL control signal from the analog phase detector 109 to the loop filter 115. The loop filter 115 filters the analog PLL control signal before being coupled to the output oscillator 120.

Generally, the hybrid PLL requires the switch 115 to alternate complete PLL control between the analog PLL 103 and the digital PLL 105 depending on whether the frequency synthesizer 100 is in an acquisition mode or is in a steady state phase locked mode. Therefore, depending upon the state of switch 115, the hybrid PLL is controlled only by the analog PLL 103 or the digital PLL 105.

Once the analog PLL 103 is phase locked, the digital PLL 105 monitors the phase and frequency lock after switching control of the hybrid PLL to the analog PLL 103. If large frequency and/or phase perturbations of the analog PLL 103 are sensed, then switch 115 switches control of the hybrid PLL completely from the analog PLL 103 to the digital PLL 105. Under such conditions, the digital PLL 105 takes complete control of the hybrid PLL to reacquire phase lock. Once phase lock is reacquired, the switch 115 switches control of the hybrid PLL completely from the digital PLL 105 to the analog PLL 103.

Generally, the digital phase detector 113 generates digital signals, e.g., pulse shaped waveforms, having pulse widths associated with the time difference, i.e., skew, between such waveforms. For example, the digital signals are coupled to the charge pump 114. Based on the pulse widths, the charge pump 114 provides the digital PLL control signal to the output oscillator 120 via the loop filter 115.

Generally, the digital phase detector 113 provides the digital control signals to the charge pump 113 in the form of digital pump up or pump down signals depending on whether the reference signal 102 is leading or lagging the output signal 121 in phase. For example, the digital phase detector 113 provides the digital pump up signals when the reference signal 102 leads the output signal 121 in phase. Conversely, the digital phase detector 113 provides the digital pump down signals when the reference signal 102 lags the output signal 121 in phase.

Unfortunately, the phase detector 113 and the charge pump 114 have response limitations, i.e., bandwidth constraints. The narrower the phase difference between the reference signal 102 and the output signal 121, the narrower the pulse widths of the digital pump up signals and digital pump down signals. Under conditions when the phase of the reference signal 102 and the output signal 121 is within a predetermined range of phase variance, the pump up signals and the digital pump down signals generally become too narrow to cause a response by the charge pump 114. Accordingly, under such conditions, the charge pump 114 transitions to a non-responsive state which drops the gain of the digital PLL 105 to virtually zero.

Generally, under conditions when the charge pump 114 provides such a zero or null output to the output oscillator 120, the digital PLL 105 is considered to be in a dead band state. The dead band state corresponds to a zone of operation in which the loop gain of the digital PLL 105 is essentially zero. The loss of digital PLL 105 gain within the dead band may be referred to as the dead band effect.

Depending on the digital implementation, the dead band effect may be a significant detriment. Typically, digital PLL designers go to great lengths to avoid the dead band effect because the dead band effect leads to greater phase noise. The phase noise is detrimentally affected especially close in frequency to the output signal 121 (i.e., at small offset frequencies from the output signal 121), for which the digital PLL 105 has little control due to minimal loop gain.

Solutions for overcoming the dead band effect include narrowing the dead band. However, narrowing the dead band typically causes an increase in circuitry complexity and cost, e.g., a more responsive charge pump 114. Other solutions include using the pulse width differences between the digital pump up signals and the digital pump down signals to adjust the charge pump 114, or providing a slight phase/frequency offset to slightly unbalance the digital PLL 105 away from the dead band. The phase/frequency offset provides some loop gain, thereby allowing the digital PLL 105 to exert some control over the hybrid PLL 100. Unfortunately, providing the phase/frequency offset is difficult to implement, requires specialized circuitry, drifts over temperature, and generally exacerbates phase noise and spurious signal issues.

SUMMARY OF THE INVENTION

One embodiment of the present invention is a frequency synthesizer that includes an analog phase lock loop configured to generate a first control signal based on a reference signal and an output signal from an output oscillator and a digital phase lock loop configured to generate a second control signal based on the reference signal and the output signal. The frequency synthesizer also includes a control circuit configured to monitor a phase difference between the output signal and the reference signal and assign control of the output signal to the first control signal and to the second control signal based on a comparison of the phase difference to a coarse phase value and a fine phase value.

Another embodiment of the present invention is a frequency synthesizer that includes an analog phase lock loop configured to generate a first control signal based on a reference signal and an output signal from an output oscillator and a digital phase lock loop configured to generate a second control signal based on the reference signal and the output signal. The frequency synthesizer further includes a control circuit configured to assign control of the output signal based on the phase difference between the output signal and the reference signal and establish a dead band state when the phase difference is within a predetermined phase range. The control circuit assigns control of the output signal to the first control signal when the digital phase lock loop is in the dead band state. The control circuit assigns proportional control of the output signal between the first control signal and the second control signal when the phase difference is within a capture range of the analog phase lock loop and within a capture range of the digital phase lock loop. The control circuit assigns control to the second control signal when the when the phase difference is greater than the capture range of the analog phase lock loop.

Another embodiment of the present invention is a method of generating an output carrier signal with an oscillator. The method includes generating a first control signal based on a reference signal and the output carrier signal with an analog phase lock loop, generating a second control signal based on the reference signal and the output carrier signal with a digital phase lock loop, and detecting a phase difference between the output carrier signal and the reference signal. The method further includes assigning control of the output signal to the first control signal and to the second control signal based upon a comparison of the phase difference to a first phase limit and a second phase limit. The first phase limit is smaller than the second phase limit.

DETAILED DESCRIPTION

The embodiments discussed herein are illustrative of one example of the present invention. As embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

In general, a hybrid frequency synthesizer is described herein. The hybrid frequency synthesizer includes an analog PLL and a digital PLL. The analog PLL provides an analog PLL control signal. The digital PLL provides a digital PLL control signal. The analog and/or digital PLL control signals provide overall phase and frequency control of an output oscillator. The output oscillator provides an output signal. Dependent upon operational states of the hybrid frequency synthesizer, the analog PLL and the digital PLL share control of the output oscillator and therefore share control of the output signal. A control circuit monitors a state of lock of the analog PLL and the digital PLL, assigns control of the output oscillator to the analog PLL and/or digital PLL, and conditions the loop gain and/or bandwidth parameters of the analog PLL and digital PLL as needed.

Through the control circuit and the analog PLL and digital PLL control signals, the analog PLL and the digital PLL share joint or separate control of the output oscillator with respect to operational states of the hybrid frequency synthesizer. For example, during one or more frequency acquisition states, the digital PLL controls the phase and the frequency of the output oscillator. During the one or more frequency acquisition states, the loop elements are configured to adjust loop gain and/or bandwidth parameters and condition the digital PLL control signal, accordingly to allow for fast frequency acquisition. During one or more phase capture modes, the digital PLL and the analog PLL share proportional control of the output oscillator. The loop elements are configured to adjust loop gain and/or bandwidth parameters accordingly for both the analog PLL and digital PLL to provide for rapid phase lock during the phase capture modes. During one or more steady state phase lock conditions, the analog PLL controls the phase and frequency control of the output oscillator. The loop elements are configured to adjust loop gain and/or bandwidth parameters accordingly to provide for a lower phase noise at the steady state phase lock conditions. During the steady state phase lock conditions the digital PLL is set to a base mode output to minimize noise.

The PLL control signals provide rapid, accurate, and robust acquisition while maintaining low noise operation. Because the digital PLL retains some measure of coarse input control of the output oscillator, the hybrid frequency synthesizer maintains lock over a wider range of conditions than a single analog PLL. In addition, the phase relationship between the reference signal and the output carrier signal can be maintained. Furthermore, although in some embodiments the analog PLL frequency locks accurately, the analog PLL may lose phase lock, in which case phase lock may be reacquired rapidly with the aid of the digital PLL. As the control circuit automatically assigns control of the output oscillator to the digital PLL and/or analog PLL, adjusts loop bandwidth and/or loop gain for the different modes between acquisition and locked states, the control circuit therefore configures the hybrid frequency synthesizer for optimum phase noise characteristics without sacrificing rapid acquisition and robust operation.

Figure 2:
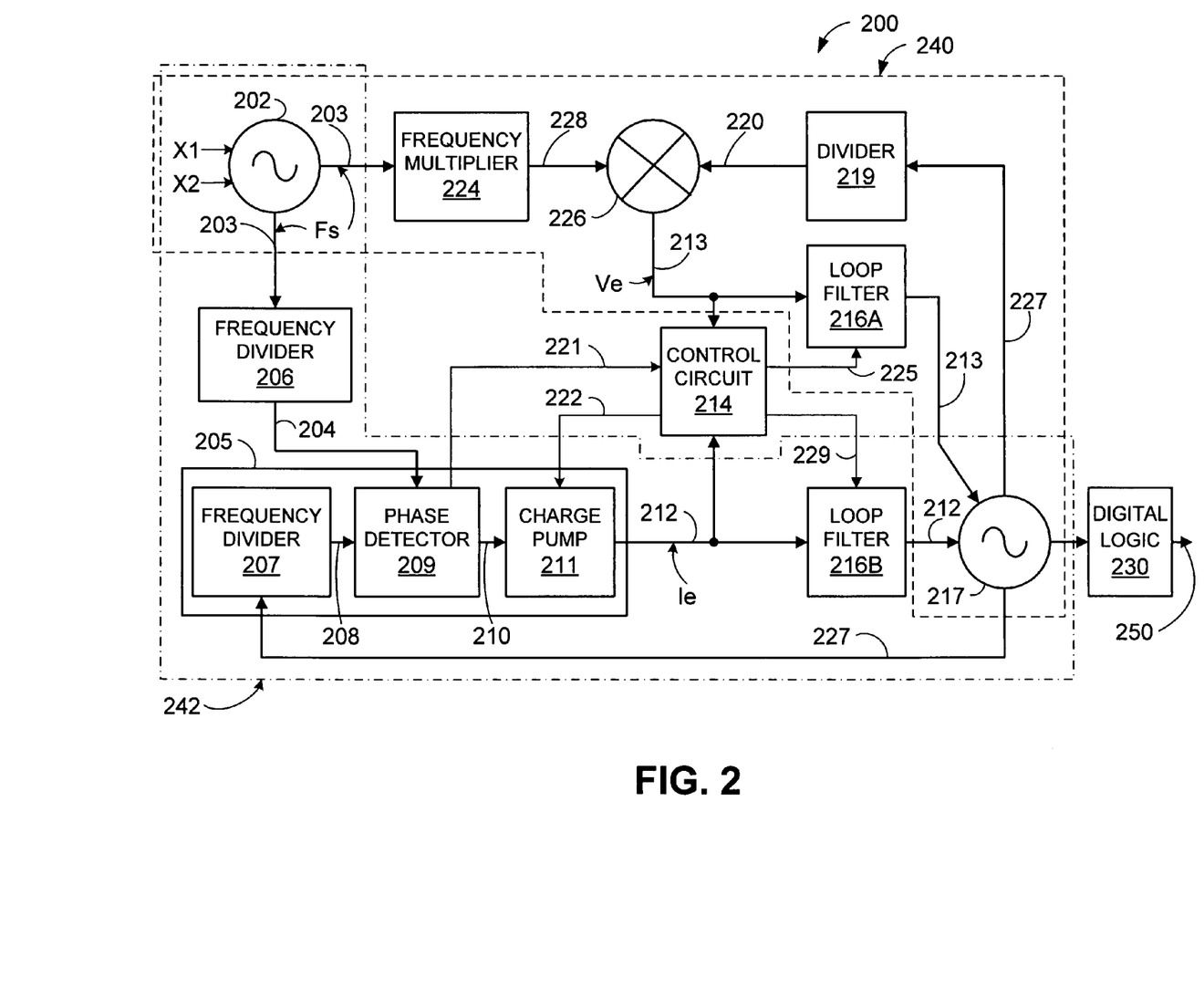
FIG. 2 is a high level schematic illustration of one embodiment of a hybrid frequency synthesizer, in accordance with the invention.

FIG. 2 is a high level schematic illustration of one embodiment of a hybrid frequency synthesizer 200, and FIGS. 3A–D are high level schematic illustrations of alternative embodiments of a frequency multiplier 224 of the analog phase lock loop of FIG. 2, in accordance with the invention. The hybrid frequency synthesizer 200 includes a reference oscillator 202, the frequency multiplier 224, an analog phase detector 226, a divider 219, a loop filter 216A, and a control circuit 214. The hybrid frequency synthesizer 200 also includes a frequency divider 206, a digital frequency synthesizer 205, a loop filter 216B, an output oscillator 217, and a digital output logic circuit 230. An output signal 227 from the output oscillator 217 is coupled to an input of the digital logic circuit 230. The digital logic circuit 230 is configured to direct the output signal 227 as an output signal 250 to external circuits (not shown) such as output buffer circuits, output dividers, etc. The reference oscillator 202 may be virtually any type of reference signal source such as a frequency generator, an oscillator, a voltage controlled oscillator (VCO), and a voltage controlled crystal oscillator (VCXO). The reference oscillator 202 may be operated by one or more input signals X1 and X2. In one configuration, the reference oscillator 202 may include an analog dividing circuit, a down converter circuit, and the like. In another embodiment of the present invention, the reference oscillator 202 is replaced with an external reference clock.

In one configuration, the hybrid frequency synthesizer 200 includes an analog phase lock loop (PLL) 240 and a digital PLL 242. It will be appreciated that the analog PLL 240 and the digital PLL 242 may comprise various components, however for clarity the description will focus on one configuration. The analog PLL 240 includes the reference oscillator 202, the frequency multiplier 224, the analog phase detector 226, the divider 219, the loop filter 216A, and the output oscillator 217. The analog PLL 240 provides an analog PLL control signal 213 to the output oscillator 217. The analog PLL control signal 213 controls the output oscillator 217 and therefore the phase and frequency of the output signal 227. In one configuration, the analog PLL control signal 213 provides fine control of the output signal 227, i.e., provides fine adjustment to the frequency and/or phase of the output signal 227 relative to a digital PLL control signal 212 described herein.

The digital PLL 242 includes the reference oscillator 202, the frequency divider 206, the digital frequency divider 207, a digital frequency/phase detector 209, a charge pump 211, the loop filter 216B, and the output oscillator 217. The digital PLL 242 provides the digital PLL control signal 212 to the output oscillator 217. The digital PLL control signal 212 controls the output oscillator 217 and therefore the phase and frequency of the output signal 227. In one configuration, the digital PLL control signal 212 provides coarse control of the output signal 227, i.e., provides coarse adjustment to the frequency and/or phase of the output signal 227 relative to the analog PLL control signal 213.

The control circuit 214 is configured to allocate overall PLL control of the output oscillator 217 and therefore the phase and frequency of the output signal 227 between the analog PLL control signal 213 and the digital PLL control signal 212. In one configuration, the control circuit 214 assigns overall control of the output signal 227 to the analog PLL control signal 213 and/or to the digital PLL control signal 212 with respect to one or more operational states of the hybrid frequency synthesizer 200 as described further below.

In one embodiment of the analog PLL 240, the reference signal 203 is coupled to the frequency multiplier 224. The frequency multiplier 224 provides a multiple signal 228 in response to the reference signal 203. In one configuration, the frequency multiplier 224 is configured to multiply the reference signal 203 to generate the multiple signal 228, e.g., $1F_s$, $2F_s$, $3F_s$ ... $NF_s$. The frequency multiplier 224 may be any type of frequency multiplier device such as one or more fixed or programmable frequency doublers in a cascade, frequency up converters, and the like. The multiple signal 228 is coupled to an input of the analog phase detector 226. A portion of the output signal 227 is processed by the divider 219 to form a divided signal 220. The divided signal 220 is coupled to another input of the analog phase detector 226. The analog phase detector 226 generates the analog PLL control signal 213 in response to mixing the multiple signal 228 and the divided signal 220. The divider 219 may be virtually any type of divider circuit or device configured to divide the output signal 227. For example, the divider 219 may be a fixed or a programmable digital divider circuit, an analog dividing circuit, a down converter circuit, and the like.

Figure 3A:
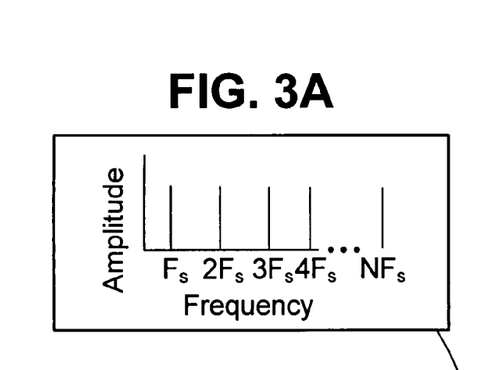
FIG. 3A is a high level graphical illustration of a plurality of harmonics of a reference frequency signal of FIG. 3B, in accordance with the invention.
Figures 3B, 3C:
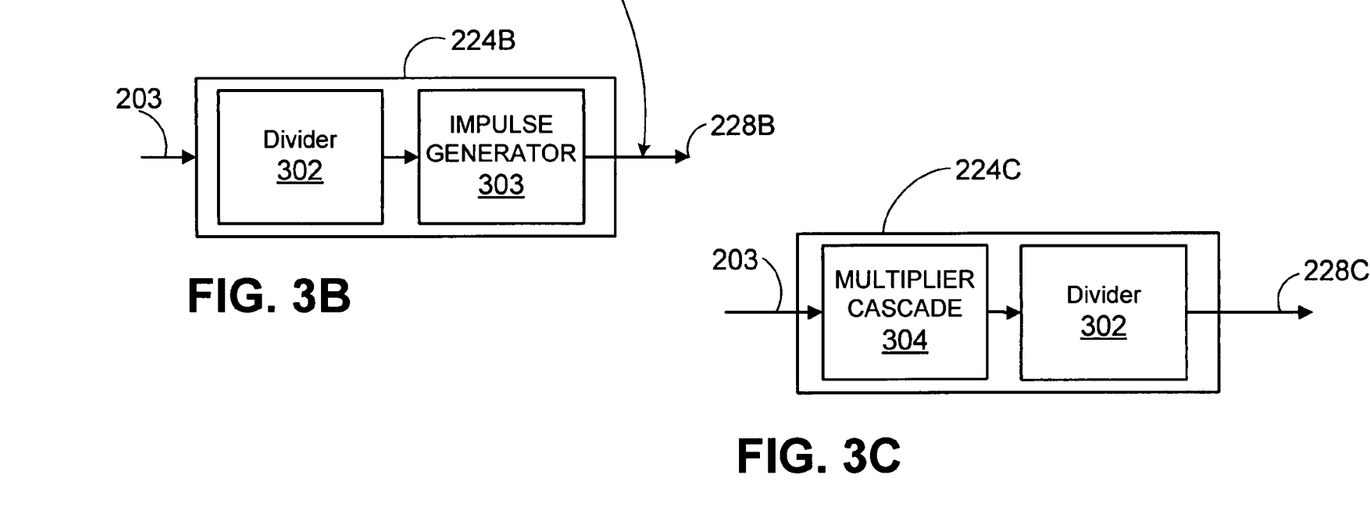
FIG. 3B is a high level schematic illustration of an alternative embodiment of a frequency multiplier of the analog phase lock loop of FIG. 2, in accordance with the invention.
FIG. 3C is a high level schematic illustration of an alternative embodiment of a frequency multiplier of the analog phase lock loop of FIG. 2, in accordance with the invention.

As illustrated in FIG. 3B, in one configuration, the frequency multiplier 224 may be configured as a frequency multiplier 224B. The frequency multiplier 224B includes a divider 302 coupled to an impulse generator 303. The divider 302 may be virtually any type of digital frequency device such as a programmable digital frequency divider, a fixed digital frequency divider, a non-integer divider, a counter circuit, and the like. The impulse generator 303 includes an output coupled to an input of the analog phase detector 226. The impulse generator 303 generates a very narrow width output pulse in response to the reference signal 203. The narrow pulse generates a multiple signal 228B having a plurality of harmonic frequencies of the reference signal 203, e.g., $F_s$, $2F_s$, $3F_s$ ... $NF_s$, where N is a harmonic number, as illustrated in FIG. 3A. The narrow pulse is sufficiently narrow in time to generate a large number of harmonics with substantially equal amplitude. The impulse generator 303 may include one or more impulse devices such as a comb generator circuit, a step recovery diode circuit, and the like, to provide the harmonics.

As illustrated in FIG. 3C, in one embodiment, the frequency multiplier 224 may be configured as frequency multiplier 224C. The frequency multiplier 224C includes a cascade of frequency multiplier devices 304 coupled to the divider 302. The combination of the frequency multiplier devices 304 and the divider 302 is configured to multiply and divide the reference signal 203 to a multiple signal 228C. One configuration of frequency multiplier devices 304 includes analog mixers configured as frequency doublers.

Figure 3D:
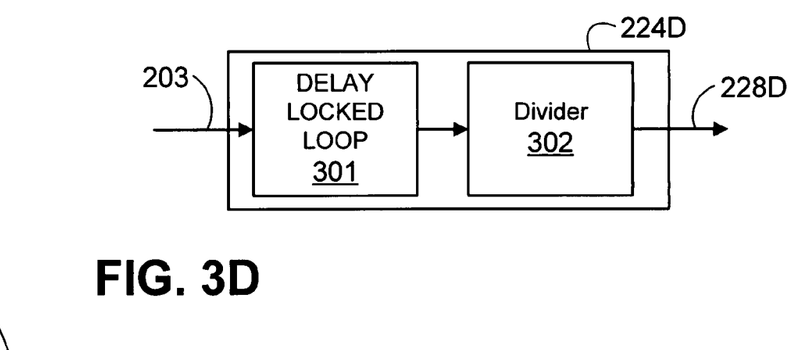
FIG. 3D is a high level schematic illustration of an alternative embodiment of a frequency multiplier of the analog phase lock loop of FIG. 2, in accordance with the invention.

As illustrated in FIG. 3D, in one configuration, the frequency multiplier 224 may be configured as a frequency multiplier 224D. The frequency multiplier 224D may include a delay locked loop (DLL) circuit 301 and the divider 302. The combination of the DLL circuit 301 and the divider 302 is configured to generate both integer and non-integer multiples of the reference signal 203 input thereto. The DLL circuit 301 may be virtually any type of DLL apparatus and circuit that may be used to advantage.

Referring to FIG. 2 and FIGS. 3A–D, the analog phase detector 226 may be a mixer configured to mix the divided signal 220 and the multiple signal 228 together to generate the analog PLL control signal 213. The analog PLL control signal 213 is generated by the analog phase detector 226 in response to a phase difference and a frequency difference between the divided signal 220 and the multiple signal 228. The analog phase detector 226 may be virtually any mixer type or circuit configured to mix the multiple signal 228 and the divided signal 220 together. In one configuration, the frequency multiplier 224 and the analog phase detector 226 are configured such that phase difference between the divided signal 220 and the multiple signal 228 is about zero degrees or 90 degrees or multiples thereof.

The analog PLL control signal 213 may be virtually any type of PLL control signal type that may be used to advantage. For example, in one embodiment, the analog PLL control signal 213 is configured as a voltage signal Ve. An amplitude and frequency of the voltage signal Ve indicates the phase difference and the frequency difference between the divided signal 220 and the multiple signal 228. The analog PLL control signal 213 is provided to an input of the control circuit 214 for processing as described further herein. For clarity, the analog PLL control signal 213 is described herein in terms of a voltage signal. However, other types of PLL control signals, such as current signals, are contemplated.

Referring to FIG. 2, in one embodiment of the digital PLL 242, the digital frequency synthesizer 205 includes the frequency divider 206, the digital frequency divider 207, a digital frequency/phase detector 209, and the charge pump 211. A sample of the output signal 227 is coupled to an input of the digital frequency divider 207. The frequency divider 206 is configured to generate a divided reference signal 204 in response to the reference signal 203. The divided reference signal 204 is coupled to an input of the digital frequency/phase detector 209. The frequency divider 206 and the digital frequency divider 207 may be virtually any type of digital frequency device such as a programmable digital frequency divider, a fixed digital frequency divider, a non-integer divider, a counter circuit, and the like.

The digital frequency divider 207 is configured to provide a digitally divided signal 208 having a similar frequency to that of the divided reference signal 204 to an input of the digital frequency/phase detector 209. The digital frequency/phase detector 209 determines a phase difference and a frequency difference between the digitally divided signal 208 and the divided reference signal 204 received thereto. The digital frequency/phase detector 209 is configured to generate an error signal 210 in response to such frequency and phase differences. The error signal 210 is coupled to an input of the charge pump 211. The charge pump 211 is configured to generate the digital PLL control signal 212 in response to the error signal 210. The digital PLL control signal 212 is coupled to an input of the loop filter 216B for conditioning as described further herein.

In one operational embodiment, the analog PLL 240 and the digital PLL 242 are configured to separately or jointly control the output oscillator 217 and therefore the output signal 227 relative to one or more operational states of the hybrid frequency synthesizer 200. For example, during a frequency acquisition state of the hybrid frequency synthesizer 200 where the phase difference between the output signal 227 and the reference signal 203 is outside the phase lock capture range of the analog PLL 240, the control circuit 214 assigns the digital PLL 242 with coarse control of the output oscillator 217. During a phase lock capture where the phase difference between the output signal 227 and the reference signal 203 is within the phase lock capture range of the analog PLL 240 and the digital PLL 242, the analog PLL 240 and the digital PLL 242 proportionally control the output oscillator 217. During a phase lock state when the analog PLL 240 is in a phase locked state and the output signal 227 is within the capture range of the analog PLL 240, the analog PLL 240 provides control of the output oscillator 217. Thus, depending on the phase difference between the output signal 227 and the reference signal 203, the control circuit 214 assigns control only to the digital PLL 242, or only the analog PLL 240, or proportional control to both the digital PLL 242 and the analog PLL 240.

In one operational embodiment, with reference to the analog PLL 240, the analog phase detector 226 mixes the multiple signal 228 to the divided signal 220 to generate the analog PLL control signal 213. A portion of the output signal 227 is coupled to an input of the divider 219. The divider 219 provides the divided signal 220 to the analog phase detector 226. The control circuit 214 monitors the phase lock state of the analog PLL 240 via the analog control signal 213. The control circuit 214 may also monitor the phase lock state of the analog PLL 240 using a phase detector output signal 221 from the digital PLL 242. The analog PLL control signal 213 is coupled to a fine input of the output oscillator 217 via the loop filter 216A to control the phase and the frequency of the output signal 227. The fine input of the output oscillator 217 generally provides more accurate control of the output signal 227 relative to a coarse control input of the output oscillator 217. Thus, the analog PLL control signal 213 finely controls the phase and frequency of the output oscillator 217.

With respect to the digital PLL 242, the divided reference signal 204 and a portion of the output signal 227 are coupled to the digital frequency synthesizer 205. The digital frequency synthesizer 205 generates the digital PLL control signal 212 and a digital phase signal 221 in response to the phase difference between the reference signal 203 and the portion of the output signal 227 coupled thereto. The control circuit 214 monitors the phase lock state of the digital PLL 242 via the digital control signal 212 and/or the digital phase signal 221. The digital PLL control signal 212 is coupled to a coarse input of the output oscillator 217 via the loop filter 216B to control the phase and the frequency of the output signal 227. The digital PLL control signal 212 coarsely controls the output oscillator 217 relative to the fine input. Therefore, as both the analog PLL control signal 213 and the digital control signal 212 are coupled to the output oscillator 217 and jointly or independently control output oscillator 217, the control circuit 214 can rapidly assign control of the output oscillator 217 to the analog PLL 240, the digital PLL 242, or both.

Figure 4:
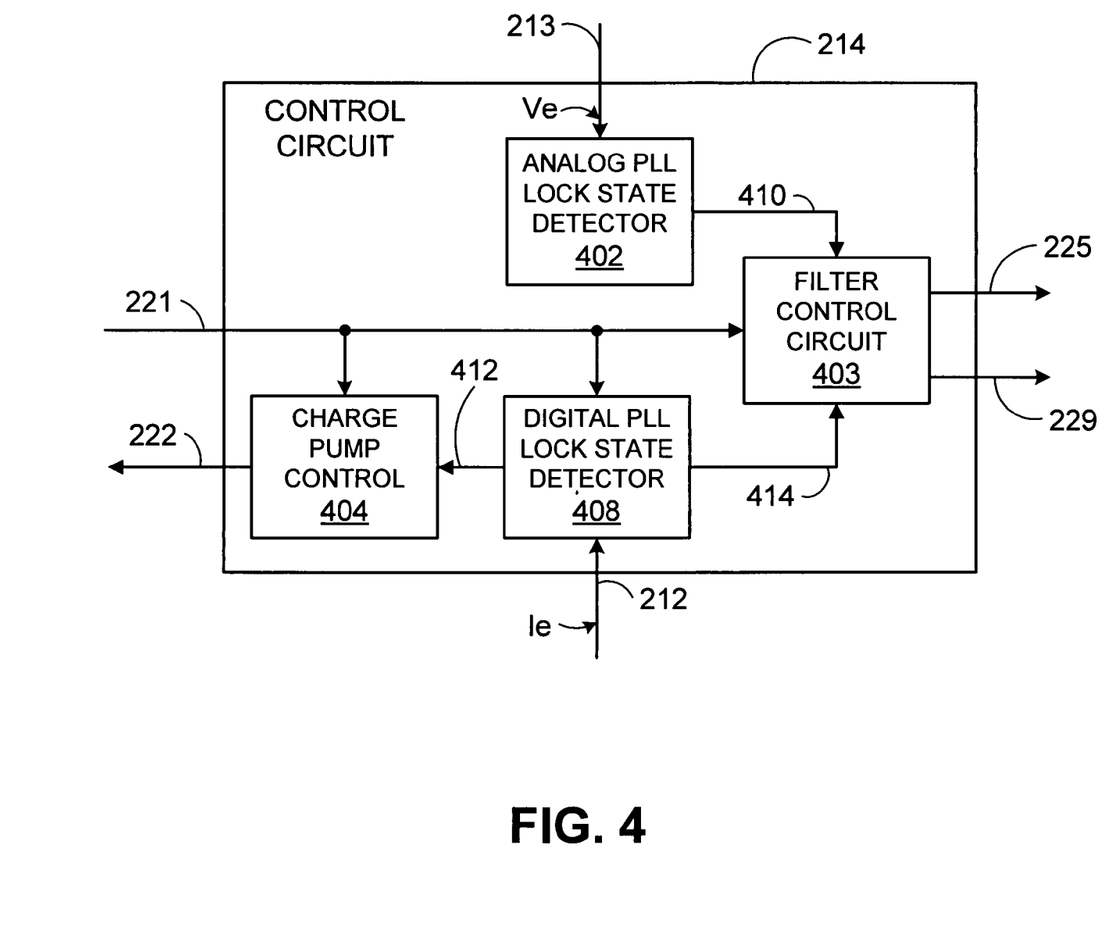
FIG. 4 is a high level schematic illustration of one embodiment of the control circuit of FIG. 2, in accordance with the invention.

FIG. 4 is a high level schematic illustration of one embodiment of the control circuit 214 of FIG. 2, in accordance with the invention. The control circuit 214 includes an analog PLL lock detector 402, a digital PLL lock detector 408, a charge pump control circuit 404, and a loop filter control circuit 403. The analog PLL lock detector 402 is configured to determine one or more lock states of the analog PLL 240. In one embodiment, the analog PLL lock detector 402 determines a phase and a frequency lock state of the analog PLL 240 in response to a voltage level Ve of the analog PLL control signal 213. In another embodiment, the analog PLL lock detector 402 determines the phase and the frequency lock state of the analog PLL 240 in response to a current level of the analog PLL control signal 213.

The digital PLL lock detector 408 is configured to determine one or more lock states of the digital PLL 242. In one embodiment, the digital PLL lock detector 408 determines a phase and a frequency lock state of the digital PLL 242 in response to a current level Ie of the digital PLL control signal 212. In another embodiment, the digital PLL lock detector 408 determines the phase and the frequency lock state of the digital PLL 242 in response to a voltage level of the digital PLL control signal 212. In one configuration, the digital frequency/phase detector 209 (See FIG. 2) couples phase/frequency lock data, e.g., a digital word of virtually any length, indicative of a phase/frequency lock state of the digital PLL 242, to the digital PLL lock detector 408 via the digital phase signal 221. The digital PLL lock detector 408 processes such digital phase/frequency lock data to determine a phase and a frequency lock state of the digital PLL 242. In other embodiments, the digital PLL lock detector 408 determines the phase and frequency lock state of the digital PLL 242 in response to a pulse width of the output signal 210 of the digital frequency/phase detector 209 and/or a pulse width of the digital PLL control signal 212.

In one embodiment, the digital PLL lock detector 408 monitors the state of phase lock of the analog PLL 240. For example, when the digital PLL lock detector 408 determines that the digital PLL 242 is phase locked, the analog PLL is also considered phase locked. In another embodiment, the digital frequency/phase detector 209 is configured with a dead band condition. The dead band condition is defined herein as the predefined range where the output of the phase detector 209 of the digital PLL 242 is unable to respond to small phase differences between the divided reference signal 204 and the digitally divided signal 208. The gain of the digital PLL 242 is virtually zero within the dead band condition. Conversely, when the digital PLL lock detector 408 determines that the digital PLL 242 is not phase locked, and is not in the dead band condition, the analog PLL is considered not phase locked. Therefore, in this configuration, the digital PLL lock detector 408 monitors the analog PLL 240 by associating phase lock conditions of the digital PLL 242 to the analog PLL 240.

In one operational embodiment, the control circuit 214 assigns the control of the output oscillator 217 between the analog PLL 240 and the digital PLL 242 relative to one or more operational states of the hybrid frequency synthesizer 200. For example, when the hybrid frequency synthesizer 200 is in a frequency acquisition mode, the control circuit 214 assigns the control of the output oscillator 217 to the digital PLL 242. When the hybrid frequency synthesizer 200 is in a phase capture mode, the control circuit 214 assigns proportional control of the output oscillator 217 to the digital PLL 242 and the analog PLL 240. When the hybrid frequency synthesizer 200 is in a phase locked mode, the control circuit 214 assigns proportional control of the output oscillator 217 to the analog PLL 240 and sets the digital PLL 242 to a base output mode.

In one operational embodiment, during the phase capture mode, the control circuit 214 varies such proportional PLL control between the digital PLL control signal 212 and the analog PLL control signal 213 relative to changing operational states of the hybrid frequency synthesizer 200. For example, the further away the analog PLL 240 is from a phase locked state, the control circuit 214 assigns a greater portion of the overall PLL control to the digital PLL control signal 212 and less control to the analog PLL control signal 213. Conversely, the closer the analog PLL 240 is to the phase locked state, the control circuit 214 assigns a reduced portion of the overall PLL control to the digital PLL control signal 212 and a greater portion to the analog PLL control signal 213.

In one embodiment, the charge pump 211 is controlled by the charge pump control circuit 404. The charge pump control circuit 404 generates a charge pump control signal 222 in response to the digital phase signal 221 and/or a digital lock state signal 412 from the digital PLL lock detector 408. In one embodiment, the proportional control of the digital PLL 242 is implemented by controlling the charge pump 211 via the charge pump control signal 222 with respect to the digital phase signal 221 and/or the digital lock state signal 412. For example, the further the analog PLL 240 is from the phase lock state, the parameters of the charge pump 211 are adjusted such that the digital PLL control signal 212 is large relative to the analog PLL control signal 213, thereby giving the digital PLL 242 a larger portion of the overall PLL control. Conversely, in the phase lock state, the parameters of the charge pump 211 may be adjusted such that the digital PLL control signal 212 is set to a base output condition configured to give the analog PLL 240 control of the output oscillator 217

In one embodiment, the filter control circuit 403 adjusts the loop gain/bandwidth of the analog PLL 240 and the digital PLL 242 relative to one or more operational states of the hybrid frequency synthesizer 200. The filter control circuit 403 receives input from the digital phase signal 221 and the analog PLL lock detector 402 via an analog lock signal 410. The filter control circuit 403 also receives input from the digital PLL lock detector 408 via a digital lock signal 414. The filter control circuit 403 may use the digital phase signal 221, the analog lock signal 410, and the digital lock signal 414, and combinations thereof, to determine the lock states of the analog PLL 240 and the digital PLL 242 and to determine their loop gain/bandwidth settings.

In one configuration, in response to the digital phase signal 221, the analog lock signal 410, and the digital lock signal 414, the filter control circuit 403 adjusts the loop gain of the analog PLL 240 and the digital PLL 242 via scaling the analog PLL control signal 213 and the digital PLL control signal 212. For example, scaling the response of the analog PLL control signal 213 sets the analog PLL 240 loop gain. The response of the analog PLL 240 may be controlled via the filter control circuit 403 adjusting parameters of the loop filter 216A via a filter control signal 225. Similarly, the filter control circuit 403 adjusts the loop gain of the digital PLL 242 by scaling the response of the digital PLL control signal 212. The response of the digital PLL 242 may be controlled via the filter control circuit 403 adjusting parameters of the loop filter 216B via the filter control signal 229 as described herein.

For example, during the frequency acquisition mode, the digital PLL 242 is responsible for an initial frequency acquisition and an initial phase lock of the output signal 227. In one embodiment, the digital PLL 242 is configured to set the output oscillator 217 such that the analog PLL 240 may frequency and phase lock the divided signal 220 to a desired harmonic of the reference signal 203 (See FIGS. 2 and 3). To provide a faster frequency acquisition, the loop gain of the analog PLL 240 may be scaled down (e.g., decreased loop gain) by adjusting the loop filter 216A, and the loop gain of the digital PLL 242 may be scaled up (e.g., increased loop gain), such that the digital PLL 242 is dominant in phase lock control.

When the output signal 227 approaches a predetermined steady state phase lock condition, the filter control circuit 403 may set the analog PLL 240, via loop filter 216A, to a steady state loop gain/bandwidth setting, and adjust the digital PLL 242, via loop filter 216B, to a base gain/bandwidth state. If such steady state condition is interrupted, the filter control circuit 403 may adjust the loop gain/bandwidth of the digital PLL 242 and the analog PLL 240 to allow the digital PLL 242 to rapidly regain dominant loop control until the predetermined phase lock condition is met. Subsequently, once the steady state phase lock condition is met, the filter control circuit 403 sets the loop gains/bandwidths of the analog PLL 240 and the digital PLL 242 to enable the analog PLL 240 to regain dominant loop control, and sets the digital PLL 242 to the base gain state.

Figure 5A:
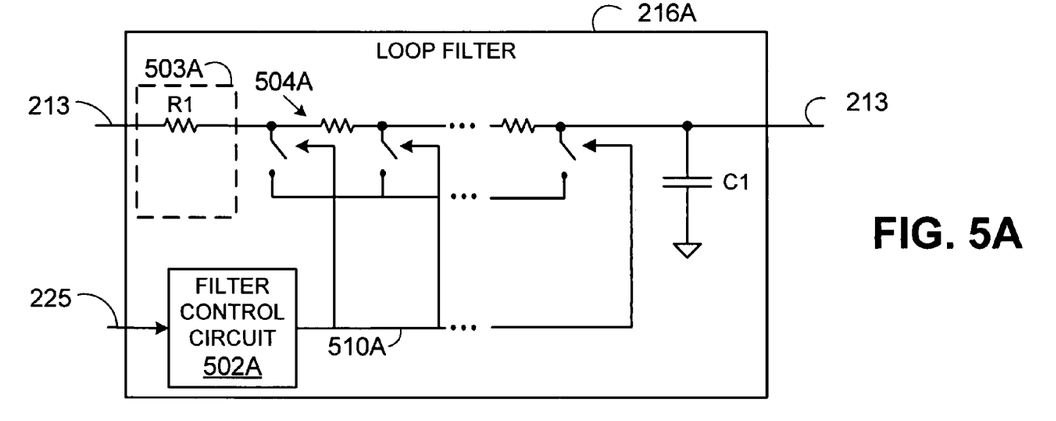
FIG. 5A is a high level schematic illustration of one embodiment of a loop filter of FIG. 2, in accordance with the invention.

FIG. 5A is a high level schematic illustration of one embodiment of the loop filter 216A of FIG. 2, in accordance with the invention. The loop filter 216A includes an input resistor 503A, a filter control circuit 502A, and a plurality of switched resistors 504A. The loop filter 216A is configured as a low pass to average the analog PLL control signal 213 coupled thereto. The capacitance C1 and the resistance between the input of R1 and the input of C1 determine the bandwidth of the loop filter 216A. The loop filter 216A is configured to adjust analog loop gain and/or bandwidth with respect to operational states of the hybrid frequency synthesizer 200. The loop filter 216A may be a low pass filter of virtually any order. In one configuration, the loop filter 216A may be configured as an integrator circuit.

The switched resistors 504A are controlled by the filter control circuit 502A via the filter control signal 225. The filter control circuit 502A may be virtually any device or circuit configured to operate the switched resistors 504A. For example, the filter control circuit 502A may be a differential transistor circuit, an operational amplifier circuit, and the like, configured to operate the switched resistors 504A.

Figure 5B:
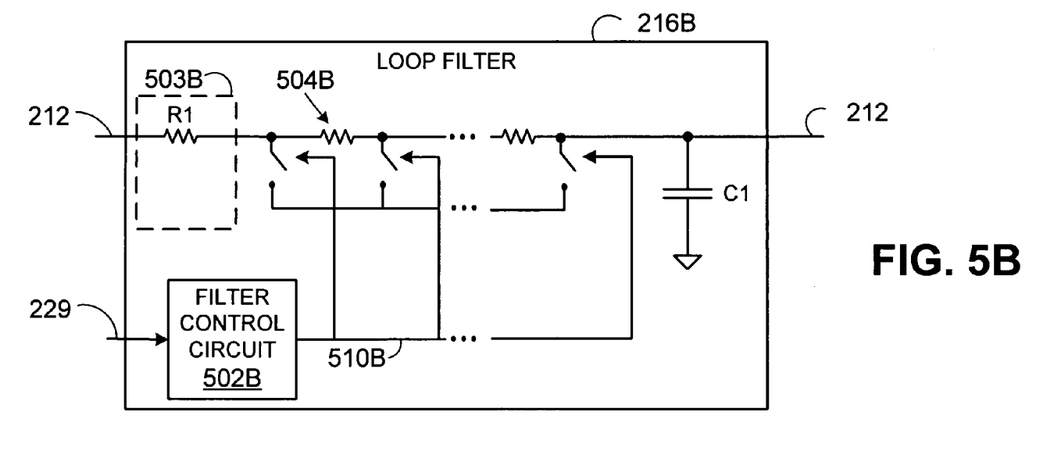
FIG. 5B is a high level schematic illustration of one embodiment of a loop filter of FIG. 2, in accordance with the invention.

FIG. 5B is a high level schematic illustration of one embodiment of the loop filter 216B of FIG. 2, in accordance with the invention. The loop filter 216B includes an input resistor 503B, a filter control circuit 502B, and a plurality of switched resistors 504B. The loop filter 216B is configured as a low pass to average the digital PLL control signal 212 coupled thereto. The capacitance C1 and the resistance between the input of R1 and the input of C1 determine the bandwidth of the loop filter 216B. The loop filter 216B is configured to configure digital loop gain and/or bandwidth with respect to operational states of the hybrid frequency synthesizer 200. The loop filter 216B may be a low pass filter of virtually any order. In one configuration, the loop filter 216B may be configured as an integrator circuit.

The switched resistors 504B are controlled by the filter control circuit 502B via a filter control signal 229. The filter control circuit 502B may be virtually any device or circuit configured to operate the switched resistors 504B. For example, the filter control circuit 502B may be a differential transistor circuit, an operational amplifier circuit, and the like, configured to operate the switched resistors 504B.

In an alternate embodiment of the invention, certain functions of the control circuit 214 can be included in the digital frequency/phase detector 209. In this alternate embodiment, the digital frequency/phase detector 209 may be configured to establish a predefined dead band condition. The predefined dead band condition, DB, may be established at a predetermined phase difference between the divided reference signal 204 and the digitally divided signal 208 where the digital frequency/phase detector 209 and the charge pump 211 force the loop gain of the digital PLL to virtually zero.

During the frequency acquisition mode where the phase difference between the reference signal 203 and the output signal 227 is large, the digital PLL 242 has dominant control of the output oscillator 217. As the digital PLL 242 forces the output signal 227 towards phase lock, the phase difference between the divided reference signal 204 and the digitally divided signal 208 narrows. When the dead band condition is met, the loop gain of the digital PLL 242 transitions to virtually zero causing the analog PLL 240 to automatically gain full control of the output oscillator 217.

If conditions are disturbed such that the phase difference between the divided reference signal 204 and the digitally divided signal 208 widens such that the dead band condition is not met, the loop gain of the digital PLL 242 returns to its normal state, automatically giving the digital PLL 242 control of the output oscillator 217.

In summary, the hybrid frequency synthesizer 200 includes the analog PLL 240 to provide the analog PLL control signal 213 and the digital PLL 242 to provide the digital PLL control signal 212. Depending upon the phase between the reference signal 203 and the output signal 227, the analog PLL control signal 213 and/or the digital PLL 242 provide phase and frequency control of the output oscillator 217 and therefore the output signal 227. When the phase difference is outside the capture range of the analog PLL 240, the digital PLL 242 coarsely controls the phase lock. When the phase difference is within the capture range of the analog PLL 240 and the digital PLL 242, the analog PLL 240 and the digital PLL 242 proportionally share control of the output oscillator 217 with respect to operational states of the hybrid frequency synthesizer 200. When the analog PLL 240 is phase locked, the analog PLL 240 finely controls the output oscillator 217.

Figure 6:
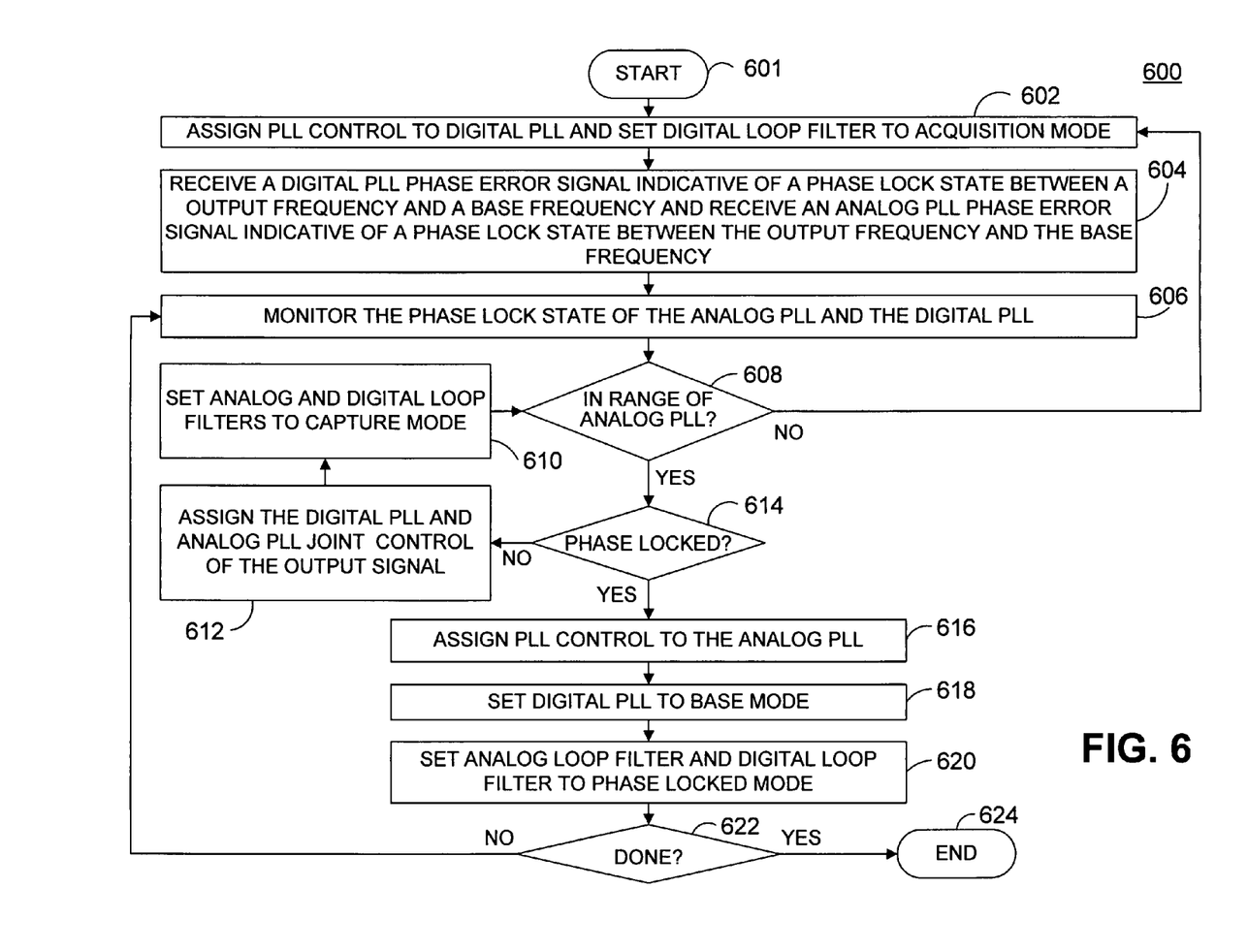
FIG. 6 is a high level flow diagram of one embodiment of a method of controlling the hybrid frequency synthesizer of FIG. 2, in accordance with the invention.

FIG. 6 is a high level flow diagram of one embodiment of a method 600 of controlling the hybrid frequency synthesizer 200 of FIG. 2, in accordance with the invention. The method 600 may be entered into at step 601 when, for example, the hybrid frequency synthesizer 200 is configured by a user thereof to generate the output signal 227. At step 602, the control circuit 214 initializes the loop parameters of the analog PLL 240, assigns control of the output oscillator 217 to the digital PLL 242, and sets the loop filter 216B to a frequency acquisition mode to allow the digital PLL 242 faster response.

At step 604, the control circuit 214 receives the digital PLL control signal 212 indicative of a phase/frequency lock state of the digital PLL 242 and the analog PLL control signal 213 indicative of a phase lock state of the analog PLL 240.

At step 606, the control circuit 214 determines the phase lock state of the analog PLL 240 and the digital PLL 242. For example, the control circuit 214 may determine the lock state of the analog PLL 240 by monitoring the analog PLL control signal 213 with analog PLL lock detector 402 (FIG. 4). The control circuit 214 may determine the lock state of the analog PLL 240 by monitoring digital PLL control signal 212 with the digital lock detector 408 (FIG. 4) and/or by monitoring the phase detector output signal 221, for example. The control circuit 214 determines the lock state of the digital PLL 242 by monitoring the digital PLL control signal 212 with the digital lock detector 408 and/or by monitoring the phase detector output signal 221.

If at step 608, the method 600 determines that the output signal 227 is within a phase lock capture range of the analog PLL 240, the method 600 proceeds to step 614 described below. If at step 608, the method 600 determines that the output signal 227 is not within the phase lock capture range of the analog PLL 240, the method 600 returns to step 602.

At step 614, if the analog PLL 240 is phase locked, then the method 600 proceeds to step 616 described below. If however, the analog PLL 240 is not phase locked then the method 600 proceeds to step 612. At step 612, the control circuit 214 assigns proportional control of the output oscillator 217 to both the analog PLL 240 and the digital PLL 242. For example, the digital PLL 242 provides a coarse control of the output oscillator 217 via the digital PLL control signal 212. The analog PLL 240 provides fine control of the output oscillator 217 via the analog PLL control signal 213. At step 610, the loop filters 216A and 216B are set to provide loop gain/bandwidths of the analog PLL 240 and the digital PLL 242, respectively, that allow for rapid phase lock capture of the output signal 227. For example, the further the phase lock state of the analog PLL 240 is from phase lock the loop filters 216A and 216B will be adjusted to provide the digital PLL 242 with more gain relative to the analog PLL 240. Conversely, the closer the analog PLL 240 is to a phase lock condition, the loop filters 216A and 216B will be adjusted to provide the analog PLL 240 with more gain relative to the digital PLL 242.

At step 616, when the analog PLL 240 is phase locked, the control circuit 214 assigns control over the frequency and the phase of the output signal 227 to the analog PLL 240. At step 618, the method 600 sets the digital PLL 242 to a base mode. In one embodiment, the base mode may be a dead band state of the digital PLL 242 where the gain of the digital PLL 242 is desensitized. The base mode may also be the control circuit 214 adjusting the output signal 210 to a predetermined pulse width output. At step 620, the method 600 configures the loop parameters, such as loop gain, of the analog PLL 240 relative to a phase locked condition for lower phase noise. At step 622, if the method 600 is finished, then the method 600 proceeds to step 624 and ends. If however, the method 600 is not finished, the method 600 proceeds to step 606.

An advantage of the hybrid frequency synthesizer 200 is that the control circuit 214 provides rapid, accurate, and robust acquisition while maintaining low noise operation. Because the digital PLL 242 monitors and retains some measure of control over the output oscillator 217, the hybrid frequency synthesizer 200 maintains lock over a wider range of conditions than a single analog PLL. In addition, the phase relationship between the reference signal 203 and the output signal 227 can be maintained. Furthermore, although in some embodiments the analog PLL 240 frequency locks very well, the analog PLL 240 may lose phase lock, in which case phase lock may be reacquired rapidly with the aid of the digital PLL 242. The control circuit 214 automatically adjusts loop bandwidth and/or loop gain for the different modes between acquisition and locked states. Further, in one configuration, the digital PLL 242 is configured to include a predefined dead band condition. Once the predefined dead band condition is initiated, the control circuit 214 assigns control of the hybrid PLL to the analog PLL 240 and desensitizes the control contribution of the digital PLL 242. The control circuit 214 therefore provides optimal noise characteristics for the hybrid frequency synthesizer 200 without sacrificing rapid acquisition and robust operation.

A further advantage of the hybrid frequency synthesizer 200 is that the PLL loop bandwidth and/or gain can be automatically adjusted for the different modes between acquisition, locked states, and one or more dead band conditions. The loop parameters therefore provide optimal noise characteristics for the hybrid frequency synthesizer 200 without sacrificing rapid acquisition and robust operation.

The invention has been described above with reference to specific embodiments. Persons skilled in the art, however, will understand that various modifications and changes may be made thereto without departing from the broader spirit and scope of the invention as set forth in the appended claims.

The invention claimed is:

1. A frequency synthesizer, comprising:
    an analog phase lock loop configured to generate a first control signal based on a reference signal and an output signal from an output oscillator;
    a digital phase lock loop configured to generate a second control signal based on the reference signal and the output signal; and
    a dedicated control circuit configured to monitor a phase difference between the output signal and the reference signal and assign control of the output signal to the first control signal and to the second control signal based on a comparison of the phase difference to a coarse phase value and a fine phase value.

2. The frequency synthesizer of claim 1, wherein the control circuit assigns dominant control of the output signal to the first control signal when the phase difference is less than the fine phase value.

3. The frequency synthesizer of claim 2, wherein the fine phase value comprises a phase lock range of the analog phase lock loop.

4. The frequency synthesizer of claim 2, wherein the control circuit is configured to set the digital phase lock loop to enter a dead band state when the phase difference is less than the fine phase value.

5. The frequency synthesizer of claim 1, wherein the control circuit proportions the control of the output signal between the first control signal and the second control signal when the phase difference is less than the coarse phase value and greater than the fine phase value.

6. The frequency synthesizer of claim 5, wherein the coarse phase value corresponds to an analog phase lock loop capture range and a digital phase lock loop capture range.

7. The frequency synthesizer of claim 1, wherein the control circuit assigns control of the output signal to the second control signal when the phase difference is greater than the coarse phase value.

8. The frequency synthesizer of claim 7, wherein the coarse phase value is greater than an analog phase lock loop capture range.

9. The frequency synthesizer of claim 1, wherein the control circuit is configured to control loop gain parameters of the digital phase lock loop and loop gain parameters of the analog phase lock loop based on the comparison of the phase difference to the coarse phase value and the fine phase value.

10. The frequency synthesizer of claim 9, further comprising a first loop filter to adjust the loop gain and bandwidth parameters of the first control signal and a second loop filter to adjust the loop gain and bandwidth parameters of the second control signal.

11. The frequency synthesizer of claim 1, wherein the analog phase lock loop further comprises a delay lock loop configured to receive the reference signal and generate a multiple frequency output of the reference signal in response thereto.

12. The frequency synthesizer of claim 11, wherein the multiple frequency output comprises a phase shift relative to the reference signal of about zero degrees or an integer multiple of 90 degrees.

13. The frequency synthesizer of claim 11, wherein the phase difference between the multiple frequency output and the signal output comprises about zero degrees or an integer multiple of 90 degrees.

14. A frequency synthesizer, comprising:
    an analog phase lock loop configured to generate a first control signal based on a reference signal and an output signal from an output oscillator;
    a digital phase lock loop configured to generate a second control signal based on the reference signal and the output signal; and
    a control circuit configured to assign control of the output signal based on the phase difference between the output signal and the reference signal and establish a dead band state when the phase difference is within a predetermined phase range, wherein the control circuit assigns control of the output signal to the first control signal when the digital phase lock loop is in the dead band state, assigns proportional control of the output signal between the first control signal and the second control signal when the phase difference is within a capture range of the analog phase lock loop and within a capture range of the digital phase lock loop, and assigns control to the second control signal when the phase difference is greater than the capture range of the analog phase lock loop.

15. The frequency synthesizer of claim 14, wherein the control circuit is further configured to monitor a lock state of the analog phase lock loop.

16. The frequency synthesizer of claim 15, wherein the control circuit assigns control of the output signal to the first control signal if the analog phase lock loop is phase locked.

17. The frequency synthesizer of claim 15, wherein the control circuit assigns control of the output signal to the second control signal if the analog phase lock loop is unlocked and the phase difference is greater than the predetermined analog phase lock loop capture range.

18. The frequency synthesizer of claim 15, wherein the control circuit assigns proportional control of the output signal between the first control signal and the second control signal if the analog phase lock loop is unlocked and the phase difference is less than the predetermined analog phase lock loop capture range.

19. A method, comprising:
    generating an output carrier signal with an oscillator;
    generating a first control signal based on a reference signal and the output carrier signal with an analog phase lock loop;
    generating a second control signal based on the reference signal and the output carrier signal with a digital phase lock loop;
    detecting a phase difference between the output carrier signal and the reference signal; and
    assigning control of the output signal with a dedicated control circuit to the first control signal and to the second control signal based upon a comparison of the phase difference to a first phase limit and a second phase limit, the first phase limit being smaller than the second phase limit.

20. The method of claim 19, wherein assigning control of the output signal comprises assigning control of the output signal to the analog phase lock loop when the phase difference is less than the first phase limit.

21. The method of claim 19, wherein allocating control of the output signal comprises providing proportional control of the output signal between the analog phase lock loop and the digital phase lock loop when the phase difference is less than the second phase limit but greater than the first phase limit.

* * * * *